(12) United States Patent
Cuoco et al.

(10) Patent No.: US 9,190,970 B2
(45) Date of Patent: Nov. 17, 2015

(54) AMPLIFIER CIRCUIT

(71) Applicant: NXP B.V., Eindhoven (NL)

(72) Inventors: Vittorio Cuoco, Nijmegen (NL);
Josephus Henricus Bartholomeus van der Zanden, Best (NL); Albert Gerardus Wilhelmus Philipus van Zuijlen, Grave (NL)

(73) Assignee: NXP B.V., Eindhoven (NL)

( * ) Notice: Subject to any disclaimer, the term of this patent is extended or adjusted under 35 U.S.C. 154(b) by 80 days.

(21) Appl. No.: 14/080,711

(22) Filed: Nov. 14, 2013

(65) Prior Publication Data

US 2014/0132353 A1    May 15, 2014

(30) Foreign Application Priority Data

Nov. 15, 2012   (EP) .................................. 12192808

(51) Int. Cl.
| | | |
|---|---|---|
| *H03F 3/68* | (2006.01) | |
| *H01L 21/50* | (2006.01) | |
| *H01L 23/66* | (2006.01) | |
| *H03F 1/02* | (2006.01) | |
| *H01L 23/00* | (2006.01) | |

(52) U.S. Cl.
CPC ........ *H03F 3/68* (2013.01); *H01L 21/50* (2013.01); *H01L 23/66* (2013.01); *H03F 1/0288* (2013.01); *H01L 24/49* (2013.01); *H01L 2224/48247* (2013.01); *H01L 2224/49111* (2013.01); *H01L 2224/49113* (2013.01); *H01L 2224/49175* (2013.01); *H01L 2924/00014* (2013.01)

(58) Field of Classification Search
CPC ................................... H03F 3/213; H03F 3/68
USPC .................................................. 330/295, 307
See application file for complete search history.

(56) References Cited

U.S. PATENT DOCUMENTS

| | | | |
|---|---|---|---|
| 4,172,261 | A | 10/1979 | Tsuzuki et al. |
| 4,649,416 | A | 3/1987 | Borkowski et al. |
| 6,734,728 | B1 | 5/2004 | Leighton et al. |
| 7,939,864 | B1 | 5/2011 | Blednov |
| 2004/0145034 | A1 | 7/2004 | Fujioka et al. |
| 2010/0140758 | A1 | 6/2010 | Doherty et al. |

FOREIGN PATENT DOCUMENTS

| | | |
|---|---|---|
| JP | 2010-11186 | 1/2010 |
| WO | 94/05038 | 3/1994 |

OTHER PUBLICATIONS

Extended European Search Report for Patent Appln. No. 12192808.9 (Jun. 25, 2013).

*Primary Examiner* — Steven J Mottola

(57) ABSTRACT

An integrated power amplifier circuit is disclosed. The circuit comprises: first and second amplifiers fabricated on one or more dies, the one or more dies being mounted on a support structure; a first set of one or more connection elements connected to the first amplifier and passing above a portion of the support structure; and a second set of one or more connection elements connected to the second amplifier and passing above a portion of the support structure. The support structure comprises at least one void, at least a portion of the at least one void being positioned directly underneath at least one of the first and second sets of one or more connection elements.

11 Claims, 6 Drawing Sheets

AMPLIFIER CIRCUIT

CROSS-REFERENCE TO RELATED APPLICATIONS

This application claims the priority under 35 U.S.C. §119 of European patent application no. 12,192,808.9, filed on Nov. 15,2012 the contents of which are incorporated by reference herein.

This invention relates to an amplifier circuit, and more particularly to a packaged power amplifier circuit.

Power amplifier circuits, such as Doherty Power Amplifier (DPA) circuits are widely used in Radio Frequency (RF) power transmitters. Doherty amplification is a well-known technique for improving the power efficiency of RF transmitters when dealing with modulated signals that have high peak-to-average ratios e.g. MC-GSM, WCDMA and OFDM (where power efficiency is defined as the ratio of average output power of the PA to the DC input power).

A schematic of a DPA in its most elementary form is shown in FIG. 1 and details of its operation are well known in the field of amplifier circuits. Consequently, detailed explanation of the DPA of FIG. 1 will be omitted.

The concept of Doherty amplification typically improves the average efficiency of a transmitter it is employed with and can provide average efficiencies of more than 50% for modern WCDMA and MC-GSM signals. It is therefore widely used in cellular and broadcast base-station transmitters.

It is widely known to combine the Main and Peak amplifier of a Doherty amplifier within a single package. In such packaged arrangements, crosstalk between the Main and Peak amplifier should be minimized in order to achieve optimal operation. It is known that to minimize crosstalk between the Main and Peak amplifiers, parasitic coupling should be avoided. This directly contradicts having two amplifiers placed next to each other in a single package because the close proximity of the amplifiers results into electromagnetic coupling at the input and output of the amplifying transistors.

Measurements have shown that a typical isolation between two amplifiers in a dual-in-package (OMP MMIC) configuration is in the order of 15 dB. This value is not considered acceptable for many applications.

Proposed is a concept for reducing the amount of electromagnetic coupling between two adjacent amplifiers on a die of an integrated circuit. Embodiments may reduce the electromagnetic coupling between two adjacent or neighbouring amplifiers fabricated on a die by having one or more voids formed in the supporting structure of the die. These voids may provide a "shortcut" for RF current returning to the die, and may be formed in both new and existing support structures.

Embodiments employ the principle that at a RF frequency, currents follow a path of reduced inductance and so take a shorter path that may be defined by a void or hole in the support structure. Reduced inductance of a shorter return path may thus reduce cross-talk. Also, a shorter return path may reduce the amount of electromagnetic coupling between returning paths.

According to an aspect of the invention, there is provided an integrated power amplifier circuit.

The at least one void may comprise: a first aperture formed in the support structure underneath a first set of one or more connection elements; and a second aperture formed in the support structure underneath a second set of one or more connection elements. In this way, a shorter return path may be provided for each set of one or more connection elements.

The connection elements may be wire bonds or bond re-bond connections.

The at least one void may comprise a segment of the support structure that has been removed, the segment extending from an edge of the support structure towards the die. In other words, a void may be formed by removing a portion of an edge of the support structure. This enables simple formation of the void. By way of example, a void may be formed by etching or drilling the supporting structure.

The horizontal extent of the at least one aperture in a first direction may greater than that of the set of one or more bond wires which the at least one aperture is positioned underneath. This may help to ensure that all return current from the set of one or more bond wires is presented with a shorter return path.

The integrated power amplifier circuit may be a Doherty power amplifier circuit, wherein the first amplifier is the main amplifier of the Doherty power amplifier circuit and the second amplifier is the peak amplifier of the Doherty power amplifier circuit. Thus, embodiments may provide a Doherty power amplifier circuit having reduced cross-talk between the main and peak amplifiers.

Existing amplifier circuits may be modified according to an embodiment of the invention so as to reduce electromagnetic coupling between two adjacent or neighbouring amplifiers fabricated on a die.

According to another aspect of the invention, there is provided a method of manufacturing an integrated power amplifier circuit.

Embodiments may be employed in a radio frequency transmitter/receiver or a mobile communication base station.

Embodiments may be packaged to provide a discrete integrated power amplifier circuit.

Embodiments may be used in combination with other measures to further reduce cross-talk and achieve required specifications.

Examples of the invention will now be described in detail with reference to the accompanying drawings, in which.

Figure 2:
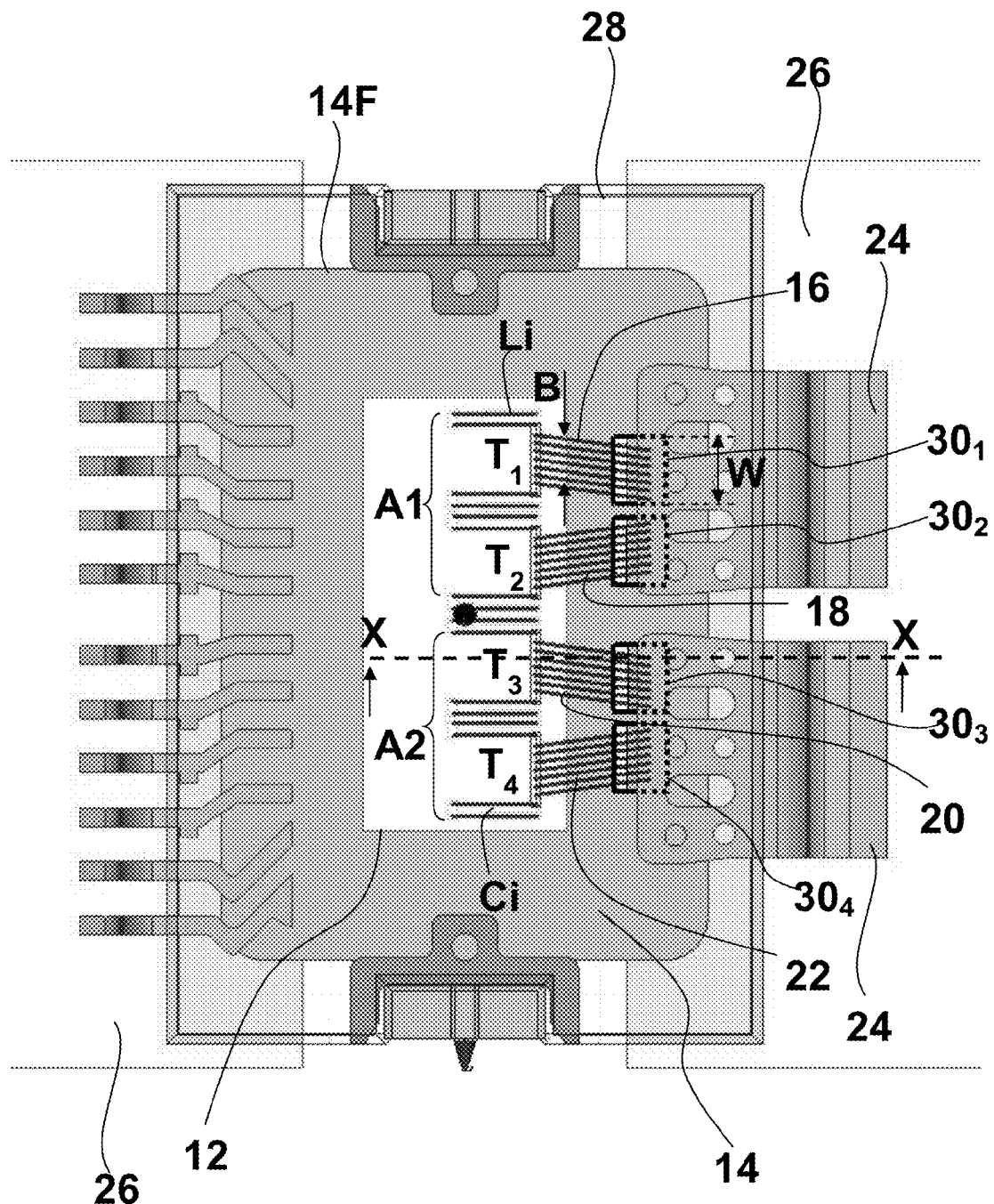
FIG. 2 is a top view of an amplifier part of an integrated circuit according to an embodiment of the invention.
Figure 3:
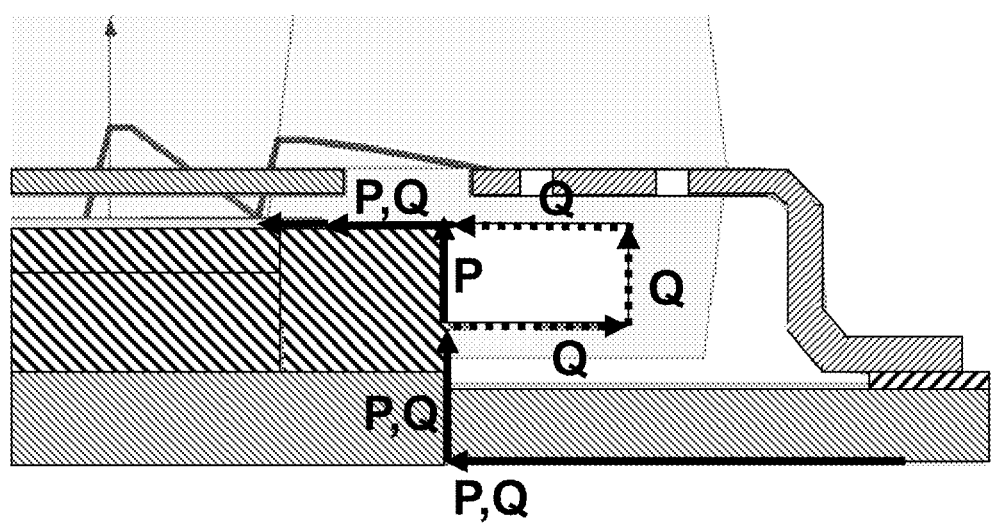
FIG. 3 is a cross-sectional view of the embodiment of FIG. 2 taken along the line X-X.

Referring to FIGS. 2 and 3, there is shown a top and cross-sectional view, respectively, of an amplifier part of an integrated circuit according to an embodiment of the invention. Here, the embodiment is a single-die, single-package dual amplifier product in over-mould-plastic (OMP).

The power amplifier circuit comprises first A1 and second A2 amplifiers fabricated on a single die 12 substantially adjacent to each other. The die 12 is mounted on a support structure 14 having a flange 14F. Here, the first A1 amplifier is former from first T1 and second T2 transistors, and the second amplifier A2 is formed from third T3 and fourth T4 transistors.

First 16 to fourth 22 sets of bond wires are connected to the first to fourth transistors, respectively, at one end. The other ends of the sets of bond wires are connected to leads 24 which make an electrical connection with a printed circuit board (PCB) 26. Thus, the sets of bond wires 16,18,20,22 are adapted to electrically connect the first A1 and second A2 amplifiers to appropriate parts of the PCB 26, such that the amplifiers A1 and A2 have their own input and output leads.

From FIGS. 2 and 3, it is seen that the sets of bond wires 16,18,20,22 are spaced vertically above the support structure 14 and its flange 14F. The die 12, the first A1 and second A2 amplifiers, and the set of bond wires 16,18,20,22, and part of the leads 24 are all encased/covered in OMP 28.

Matching Li wires and matching capacitors Ci are provided for each of the first T1 to fourth T4 transistors.

Figure 1:
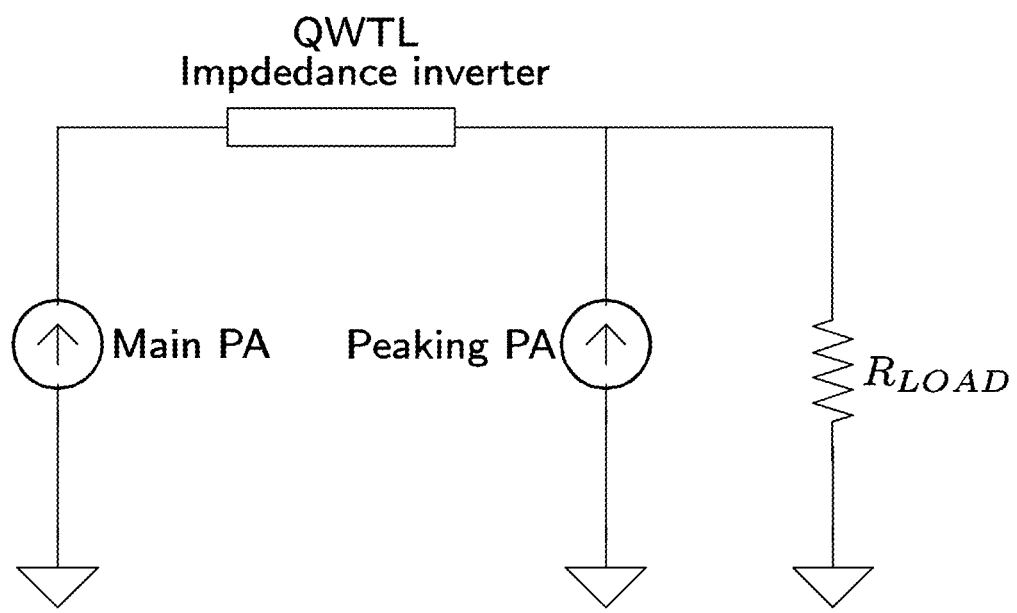
FIG. 1 is a diagram of a conventional DPA circuit.

The flange 14F of the support structure 14 comprises first $30_1$ to fourth $30_4$ apertures situated (at least in part) directly underneath the first 16 to fourth 22 sets of bond wires, respectively. In other words, vertically below (when viewed from above as in FIG. 1) each set of bond wires, there is provided a portion of a hole/aperture 30 in the flange 14F of the support structure. Here, the horizontal extent of each aperture a lateral direction (i.e. the direction from top to bottom of the page of FIG. 2), as indicated by the arrow labelled "W", is greater than the lateral extent of the set bond wires which the aperture is positioned below, as indicated by the arrow labelled "B". Thus, when expressed as an equation, W>B.

Turning now specifically to FIG. 3, there is shown a cross-sectional view of the embodiment of FIG. 2 taken along the line X-X (and in the direction indicated by the accompanying arrows).

In FIG. 3, it is shown how, at a RF frequency, the return current takes the path of minimal inductance, and therefore of minimum distance. The aperture $30_3$ provides a 'short-cut' for current return path as indicated by the solid black arrows labelled "P". By way of comparison, if the aperture $30_3$ was not provided in the flange 14F of the support structure 14 (as in a conventional arrangement), the current return path would extend around the outside surface of the flange 14F as indicted by the dotted arrows labelled "Q". It will therefore be appreciated that the aperture $30_3$ provides a current return path of reduced length when compared to a conventional arrangement. This shorter return path provides a reduced inductance and thus helps to reduce cross-talk (e.g. by reducing parasitic coupling between the first A1 and second A2 amplifiers).

Figure 4:
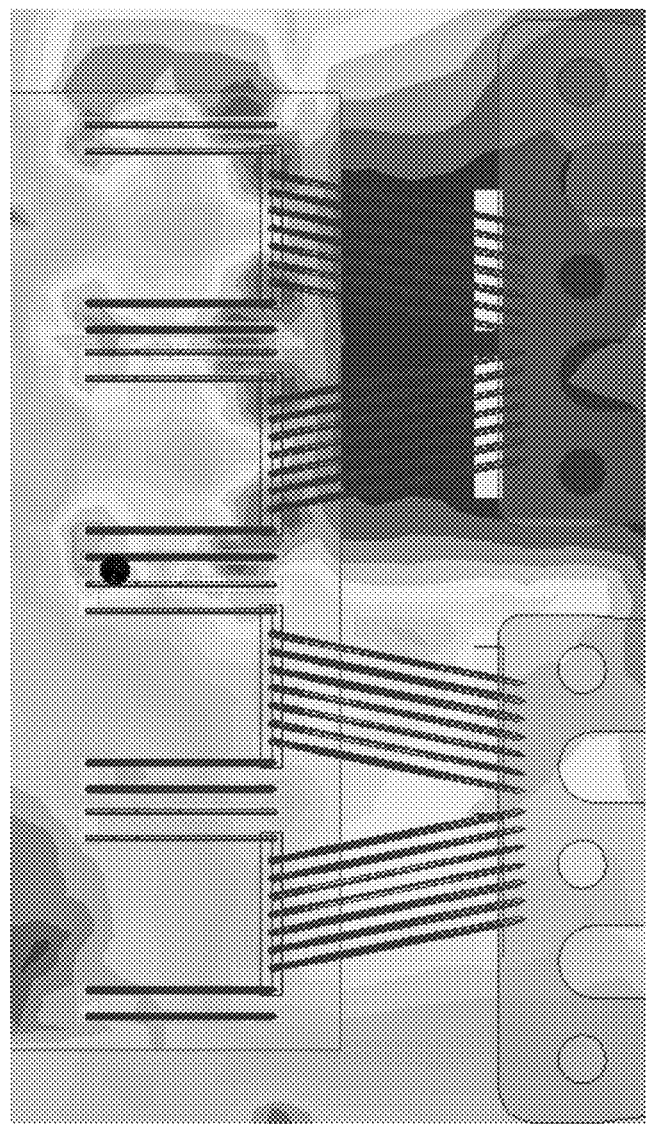
FIG. 4 is a visual representation of the results of a 3D electromagnetic simulation for the embodiment of FIGS. 2 and 3.

Such reduction in cross-talk is illustrated by FIG. 4 which shows the results of a 3D electromagnetic simulation for the embodiment of FIGS. 2 and 3. In FIG. 4, the darker areas identify electromagnetic fields of greater magnitude than the lightly coloured areas. Hence, from FIG. 4, it can be seen that the electromagnetic field is concentrated within the vicinity of the first 16 and second 18 set of bond wires and does not spread to the third set of bond wires 20. This indicates that, with holes the apertures formed in the flange, the returning current of the first amplifier A1 is confined to its section and the electromagnetic coupling to the second amplifier A2 is significantly reduced.

Experiments may be undertaken using such simulations to optimize the position(s) of aperture(s) formed in the flange 14F to minimize electromagnetic coupling between the adjacent amplifiers.

Figure 5:
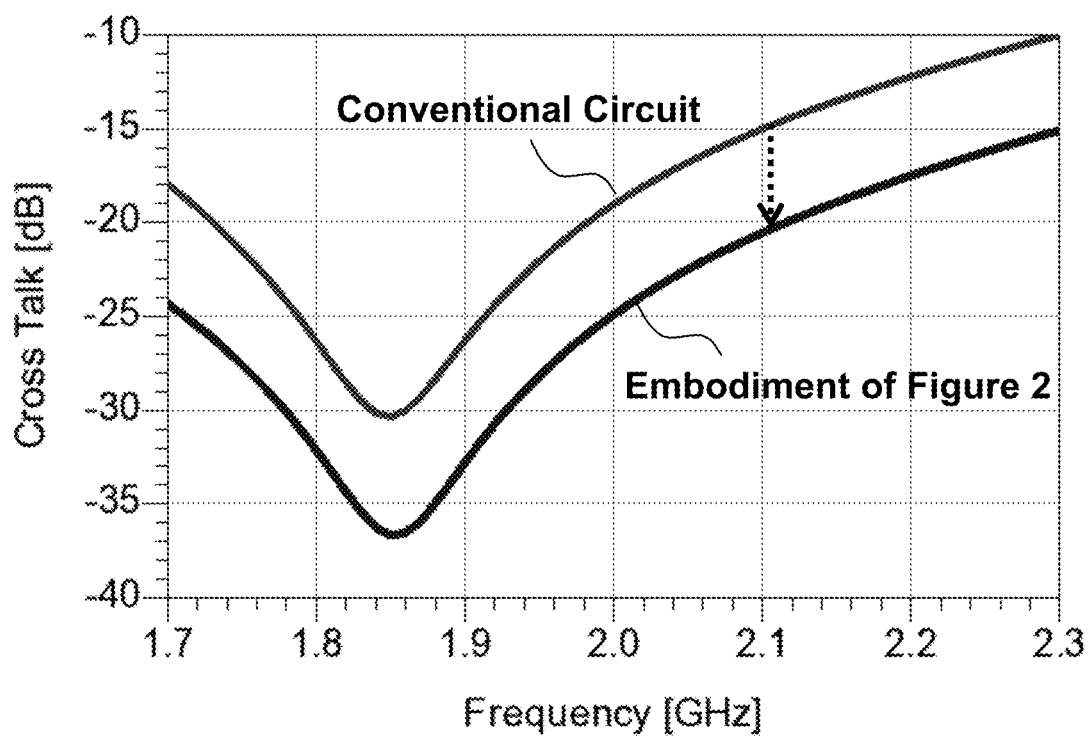
FIG. 5 is a is a graph illustrating the variation of cross-talk with frequency for a conventional integrated dual amplifier circuit and for the dual embodiment of FIGS. 2 and 3.

A benefit provided by the embodiment of FIGS. 2 and 3 is illustrated by the graph of FIG. 5, which plots the amount of cross-talk against frequency for a conventional integrated dual amplifier circuit and for the dual amplifier circuit of FIGS. 2 and 3. From FIG. 5 it can be seen that the embodiment of the invention provide a reduction in cross-talk of approximately 5 dB across a wide range of frequencies. In particular it is noted that the conventional circuit exhibits cross-talk of approximately −15 dB at 2.14 GHz (which is a commonly employed radio frequency), whereas the embodiment of the invention exhibits cross-talk of approximately −21 dB at 2.14 GHz. This represents a significant decrease in cross-talk.

Figure 6:
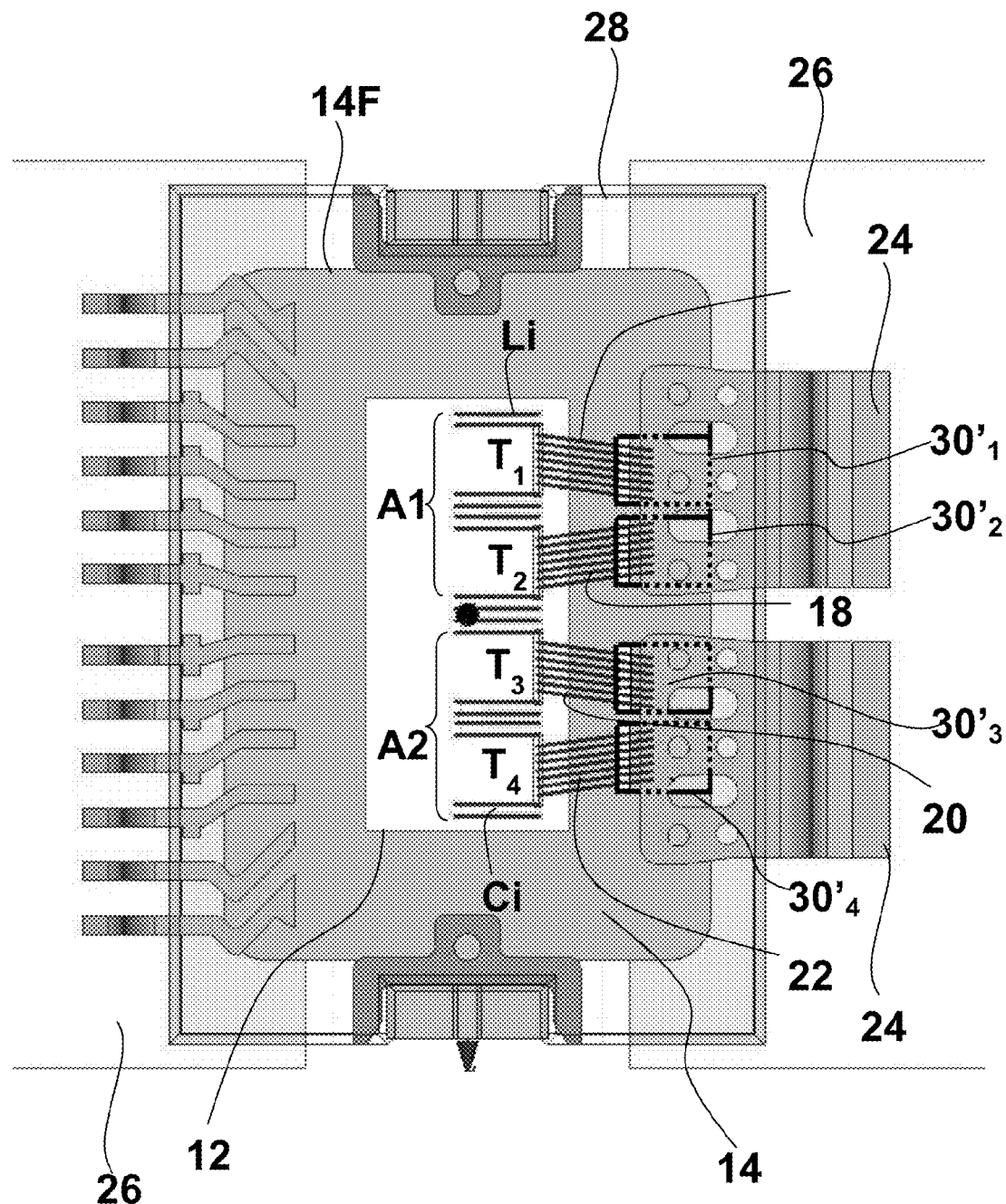
FIG. 6 illustrates a modification to the embodiment of FIG. 2.

Referring now to FIG. 6, there is shown a modification to the embodiment of FIG. 2. Except for the apertures formed in the flange 14F of the support structure 14, the embodiment of FIG. 6 does not differ from the embodiment of FIG. 2. A detailed description of all of the features shown in FIG. 6 will therefore be omitted. However, where the embodiment of FIG. 6 does differ is that first $30'_1$ to fourth $30'_4$ voids are formed in the flange 14F (instead of apertures like that in the embodiment of FIG. 2). Here, the voids are oblong-shaped areas or segments that have been removed from the flange 14F. These voids extend from the edge of the flange inwardly towards to the die to an extent that a portion of each void $30'_1$, $30'_2$, $30'_3$, $30'_4$ is situated underneath a respective set of wire bonds 16,18,22,24.

Accordingly, it will be understood that a void may comprise a segment of the support structure that has been removed. In other words, a void may be formed by removing a portion the support structure. This enables simple formation of the void (by chemical etching or mechanical drilling, for example).

Various modifications will be apparent to those skilled in the art. For example, although the above described embodiments comprise an amplifier formed from two transistors, other embodiments may employ amplifiers formed from one or more transistors, and the different amplifiers may be formed from different numbers of transistors. Also, although the above described embodiments comprise amplifier formed on a single die, other embodiment may comprise more than one die. Furthermore, although the above described embodiment comprise a single aperture or void under each set of connection elements, alternative embodiments may employ other arrangements of apertures or void in the flange under the sets of connection elements. By way of example, the embodiment of FIGS. 2 and 3 may be modified so as to comprise first and second voids in the flange, wherein the first void is situated underneath both the first and second sets of connection elements, and wherein the second void is situated underneath both the third and fourth sets of connection elements.

The invention claimed is:

1. An integrated power amplifier circuit comprising:
   first and second amplifiers fabricated on one or more dies, the one or more dies being mounted on a support structure;
   a first set of one or more connection elements connected to the first amplifier and passing above a portion of the support structure; and
   a second set of one or more connection elements connected to the second amplifier and passing above a portion of the support structure,
   wherein the support structure comprises at least one void, at least a portion of the at least one void being positioned directly underneath at least one of the first and second sets of one or more connection elements; and
   wherein the support structure comprises a flange, and wherein the at least one void is formed in the flange.

2. The circuit of claim 1, wherein the at least one void comprises:
   a first aperture formed in the support structure underneath the first set of one or more connection elements; and
   a second aperture formed in the support structure underneath the second set of one or more connection elements.

3. The circuit of claim 1, wherein the at least one void comprises a segment of the support structure that has been removed, the segment extending from an edge of the support structure towards the die.

4. The circuit of claim 1, wherein the first and second amplifiers are substantially adjacent to each other.

5. The circuit of claim 1, wherein the horizontal extent of the at least one aperture in a first direction is greater than that of the set of one or more connection elements which the at least one aperture is positioned underneath.

6. The circuit of claim 1, wherein the integrated power amplifier circuit is a Doherty power amplifier circuit, and wherein the first amplifier is the main amplifier of the Doherty power amplifier circuit and the second amplifier is the peak amplifier of the Doherty power amplifier circuit.

7. The circuit of claim 1, wherein at least one of the first and second amplifiers comprises a plurality of amplifying transistors.

8. A radio frequency transmitter comprising an integrated power amplifier circuit according to any claim 1.

9. A mobile communication base station comprising an integrated power amplifier circuit according to claim 1.

10. A packaged integrated circuit comprising an integrated power amplifier circuit according to claim 1.

11. A method of manufacturing an integrated power amplifier circuit comprising:
    providing first and second amplifiers on one or more dies, the one or more dies being mounted on a support structure having a flange;
    providing a first set of one or more connection elements connected to the first amplifier and passing above a portion of the support structure;
    providing a second set of one or more connection elements connected to the second amplifier and passing above a portion of the support structure; and
    forming at least one void in the flange of the support structure, at least a portion of the at least one void being positioned directly underneath at least one of the first and second sets of one or more connection elements.

* * * * *